US012216161B2

(12) United States Patent
Yang et al.

(10) Patent No.: US 12,216,161 B2
(45) Date of Patent: Feb. 4, 2025

(54) SCAN CHAIN ANALYSIS USING PREDEFINED CAPTURE SIGNATURE

(71) Applicant: Apple Inc., Cupertino, CA (US)

(72) Inventors: Bo Yang, Santa Clara, CA (US);
Antonietta Oliva, Sausalito, CA (US);
Michael R. Seningen, Austin, TX (US);
Vasu P. Ganti, Los Altos, CA (US);
Vijay M. Bettada, Fremont, CA (US)

(73) Assignee: Apple Inc., Cupertino, CA (US)

( * ) Notice: Subject to any disclaimer, the term of this patent is extended or adjusted under 35 U.S.C. 154(b) by 65 days.

(21) Appl. No.: 18/323,946

(22) Filed: May 25, 2023

(65) Prior Publication Data
US 2024/0393394 A1    Nov. 28, 2024

(51) Int. Cl.
*G01R 31/00* (2006.01)
*G01R 31/3185* (2006.01)

(52) U.S. Cl.
CPC .......... *G01R 31/318536* (2013.01); *G01R 31/318544* (2013.01)

(58) Field of Classification Search
CPC .... G01R 31/318533; G01R 31/318544; G01R 31/318536; G01R 31/31813; G01R 31/31921; G01R 31/318525
See application file for complete search history.

(56) References Cited

U.S. PATENT DOCUMENTS

| | | | |
|---|---|---|---|
| 7,076,707 B2 | 7/2006 | Lee et al. | |
| 8,356,221 B2 | 1/2013 | Kuo et al. | |
| 8,826,087 B2 * | 9/2014 | Tekumalla | G01R 31/318572 714/729 |
| 8,924,801 B2 * | 12/2014 | Tekumalla | G01R 31/318547 714/30 |
| 9,110,138 B2 | 8/2015 | Guo et al. | |
| 9,401,223 B2 * | 7/2016 | Ziaja | G11C 29/32 |
| 9,547,043 B2 * | 1/2017 | Ahmed | G01R 31/3177 |
| 9,557,382 B1 | 1/2017 | Gurtovnik | |
| 9,945,904 B1 | 4/2018 | Song | |

(Continued)

OTHER PUBLICATIONS

International Search Report and Written Opinion in PCT Appl. No. PCT/US2024/029299 mailed Sep. 2, 2024, 8 pages.

(Continued)

*Primary Examiner* — Esaw T Abraham
(74) *Attorney, Agent, or Firm* — Kowert, Hood, Munyon, Rankin & Goetzel, P.C.; Scott W. Pape; Dean M. Munyon

(57) ABSTRACT

An apparatus includes a plurality of circuit blocks, a plurality of scan-enabled flip-flop circuits, and a plurality of scan signature circuits. The plurality of scan-enabled flip-flop circuits may be coupled in a sequential manner across the plurality of circuit blocks, and be configured to shift a scan chain test signal from a test input interface to a test output interface. The plurality of scan signature circuits may be coupled to respective ones of a subset of the plurality of scan-enabled flip-flop circuits, and be configured to, in response to a particular test signal, concurrently load a known scan-chain pattern to the subset of the scan-enabled flip-flop circuits. The plurality of scan-enabled flip-flop circuits may be further configured to sequentially output at least a portion of the known scan-chain pattern to the test output interface.

20 Claims, 11 Drawing Sheets

(56) References Cited

U.S. PATENT DOCUMENTS

| | | | |
|---|---|---|---|
| 10,184,980 B2* | 1/2019 | Maheshwari | G01R 31/3177 |
| 11,073,556 B2* | 7/2021 | Cheng | G06F 30/333 |
| 11,073,558 B2* | 7/2021 | Wu | G01R 31/318544 |
| 11,209,481 B2* | 12/2021 | Maheshwari | G01R 31/31703 |
| 11,579,191 B2 | 2/2023 | Wu et al. | |
| 2009/0119556 A1 | 5/2009 | Balakrishnan et al. | |
| 2010/0138708 A1 | 6/2010 | Rajski et al. | |
| 2011/0258505 A1 | 10/2011 | Majumdar et al. | |
| 2013/0173976 A1 | 7/2013 | Tekumalla et al. | |

OTHER PUBLICATIONS

Yu Huang et al. "Survey of Scan Chain Diagnosis," IEEE Design & Test of Computers, IEEE, vol. 25, Issue 3, May 30, 2008, pp. 240-245.

* cited by examiner

800

*Shifting, by a scan chain that includes a plurality of scan-enabled flip-flop circuits, a scan-chain pattern from an input port of a test interface of an integrated circuit to an output port of the test interface, wherein at least one of the plurality of scan-enabled flip-flop circuits fails to shift the scan-chain pattern.*
810

*After the scan-chain pattern fails to be shifted to the output port, concurrently loading, by a plurality of scan signature circuits that are coupled to respective ones of a subset of the plurality of scan-enabled flip-flop circuits, a known scan-chain pattern to the subset of the scan-enabled flip-flop circuits.*
820

*Shifting, by a functioning portion of the scan chain, at least a portion of the known scan-chain pattern to the output port.*
830

```
After shifting the at least the portion of the known scan-chain pattern to the output port,
concurrently loading, by the plurality of scan signature circuits, an inverse of the known
scan-chain pattern to the subset of the scan-enabled flip-flop circuits.
910
```

```
Shifting, by the functioning portion of the scan chain, at least a portion of the inverse of
known scan-chain pattern to the output port.
920
```

```
Identifying, by a test circuit, a failing one of the plurality of scan-enabled flip-flop circuits.
930
```

```
Enabling, by the test circuit, an alternate scan chain path that avoids the failing scan-
enabled flip-flop circuit in the scan chain.
940
```

*FIG. 9*

SCAN CHAIN ANALYSIS USING PREDEFINED CAPTURE SIGNATURE

BACKGROUND

Technical Field

Embodiments described herein are related to computing systems, including systems-on-a-chip (SoCs). More particularly, embodiments are disclosed relating to techniques for using scan chain analysis in an SoC.

Description of the Related Art

Scan-based diagnosis is a testing technique that may be employed on integrated circuits (ICs) that include clocked logic circuits, such as systems-on-a-chip (SoCs). The techniques use scan-enabled storage circuits, e.g., flip-flop circuits, coupled into one or more scan chains. One or more scan-chain patterns may then be applied to a test input interface and shifted through the scan chains, until outputs are available at a test output interface. If the scan test output matches an expected output, then the logic circuits included in the scan chains may be functioning properly. In cases where one or more scan outputs deviate from the expected values, one or more logic circuits in the corresponding scan chains may be failing. Scan-based diagnosis is widely used to identify yield limiters in logic circuits. When scan chain patterns shift properly, outputs indicating failures can be analyzed to identify particular logic circuits that failed. To concurrently load the known scan-chain pattern, a given one of the plurality of scan signature circuits is configured to shift a corresponding portion of the known scan-chain pattern into a scan input node of the respective one of the subset of scan-enabled flip-flop circuits. But diagnosing scan output failures may be challenging if flip-flop circuits located after failed points in a given scan chain cannot be set properly during a scan-chain pattern load. In addition, flip-flop circuits located before broken points in the scan chain cannot be observed during a scan chain unload. Complicated and expensive debug processes may be needed in order to identify failing circuits in such cases. Furthermore, as 3-D stacking of IC chips and backside metallization become more prevalent in SoC designs, some of these debug processes may not be feasible since physical access to signal lines carrying a given scan-chain pattern may be blocked by interconnects.

BRIEF DESCRIPTION OF THE DRAWINGS

The following detailed description makes reference to the accompanying drawings, which are now briefly described.

FIG. 8 illustrates a flow diagram of an embodiment of a method for scan testing a system-on-chip that includes a scan chain with scan signature circuits.

FIG. 9 shows a flow diagram of an embodiment of another method for scan testing a system-on-chip that includes a scan chain with scan signature circuits.

Figure 1:
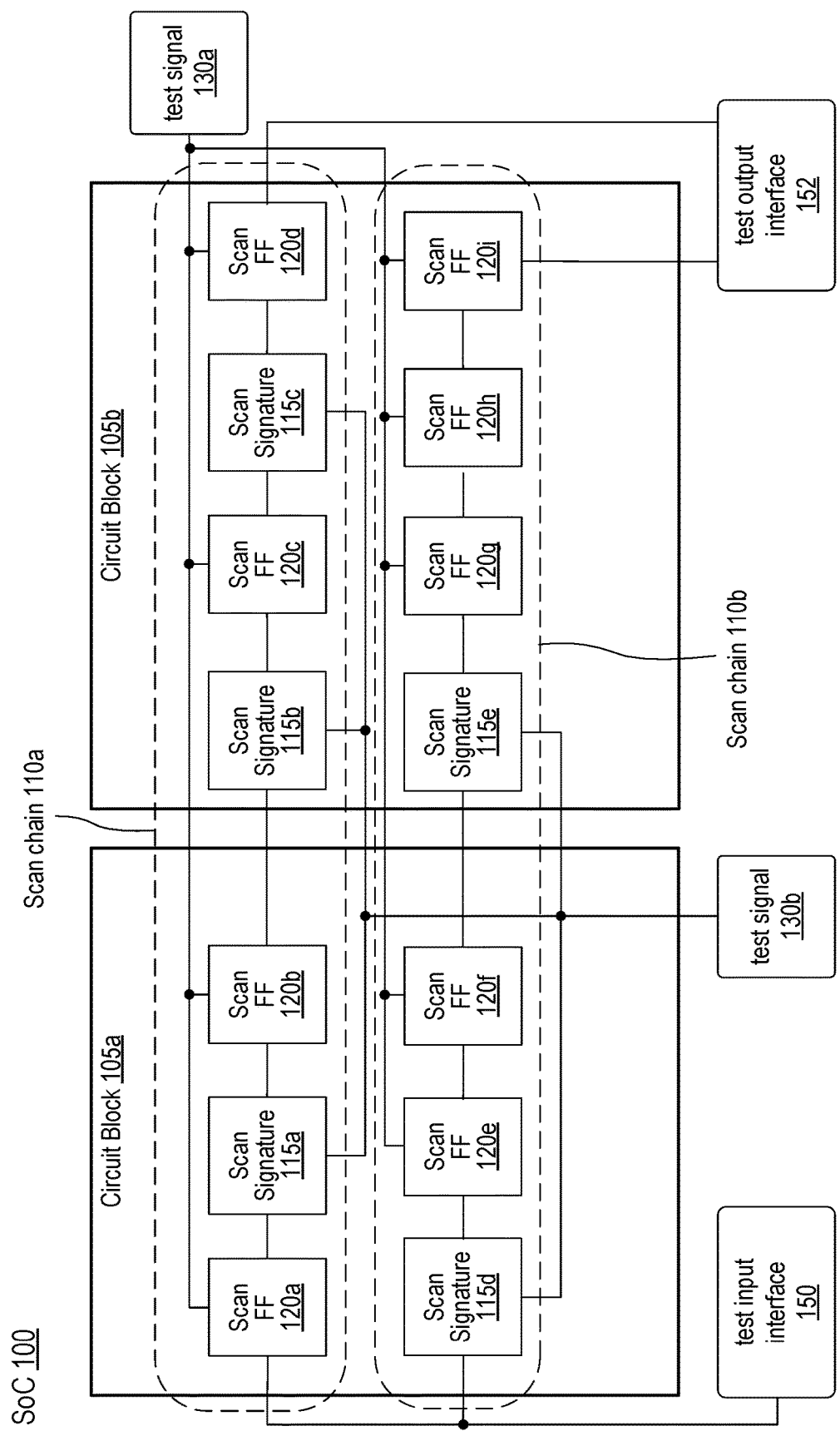
FIG. 1 illustrates a block diagram of an embodiment of a system-on-chip that includes scan chains with scan signature circuits.

While embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims.

DETAILED DESCRIPTION OF EMBODIMENTS

As disclosed above, scan-based diagnosis is a technique that can be used to identify failing logic circuits in an IC. In some cases, logic failures may be random occurrences due to an imperfection during manufacturing, e.g., a speck of dust that has landed on an IC during fabrication, causing a particular transistor to function improperly. In other cases, a particular logic circuit may have a high rate of failure across a significant number of dies, potentially indicating a yield issue with the logic circuit. In such cases, identifying the particular failing logic circuit may allow a design team to revise the design to make it more robust and thus less prone to failure. A higher yield may lead to a lower cost IC, thereby enabling products to be more competitively priced and/or more profitable. Higher yielding ICs may also result in end products with a higher reliability.

As used herein, a "scan chain" refers to logic circuits, including scan-enabled storage circuits, that are coupled together to propagate one or more scan-chain patterns from an input interface to an output interface. A "scan-chain pattern" refers, herein, to a pattern of logic data (e.g., zeroes and ones) that may be loaded into scan-enabled storage circuits included in a scan chain and shifted out to test functionality of the logic circuits included in the scan chain. A "scan-enabled storage circuit" refers, herein, to a clocked storage element (e.g., a flip-flop circuit) that can be enabled in a scan mode and shift a bit of a scan-chain pattern in response to a particular transition of a scan clock signal.

A typical scan test technique includes serially shifting, from external test equipment to a scan test input of an IC, pattern bits of a scan-chain pattern comprised of a string of logic highs and lows. Successive scan clock transitions may cause the pattern bits to shift from a first scan-enabled storage circuit (e.g., a scan-enabled flip-flop) in the scan chain to a next to scan-enabled storage circuit in the chain. When a last scan-enabled storage circuit of the chain is reached, the output of the scan-chain pattern is presented at a scan test output of the IC where the external test equipment may receive the scan-chain output pattern and compare it to an expected pattern. If, however, one or more of the scan-enabled storage circuits has a stuck-at-one or stuck-at-zero fault (collectively referred to as "stuck-at faults"), then the scan-chain output pattern may simply be a string of all ones or all zeroes. In such cases, determining which scan-enabled storage circuit in the chain is faulty.

A novel technique is disclosed in which predefined scan signature logic is added to scan-enabled storage circuits in the IC. In a first mode, for example, all scan-enabled storage circuits that include the scan signature logic may be initialized, concurrently, with a first predefined scan-chain pattern. In a second mode, these scan-enabled storage circuits may be initialized, concurrently, with a second predefined scan-chain pattern which, in some cases, may be the inverse of the first pattern. The initialized scan-chain patterns may be shifted out in each mode. Since the scan-enabled storage circuits are initialized by the additional scan signature logic rather than by shifting in a scan-chain pattern, scan-enabled storage circuits before and after a failing circuit in the scan chain may be loaded with either of the known patterns. Any deviation from the known patterns may indicate a malfunctioning logic circuit. Use of two known patterns may enable identification of a logic circuit with either a stuck-at-one or stuck-at-zero fault (collectively referred to as "stuck-at faults").

The present disclosure considers novel circuits for use in an integrated circuit (IC) to implement a technique for identifying failed logic circuits in a scan chain. An example apparatus (e.g., an IC) may include a plurality of circuit blocks, a plurality of scan-enabled flip-flop circuits, and a plurality of scan signature circuits. The plurality of scan-enabled flip-flop circuits may be coupled in a sequential manner across the plurality of circuit blocks, and configured to shift a scan chain test signal from a test input interface to a test output interface. The plurality of scan signature circuits may be coupled to respective ones of a subset of the plurality of scan-enabled flip-flop circuits. In response to a particular test signal, the plurality of scan signature circuits may concurrently load a known scan-chain pattern to the subset of the scan-enabled flip-flop circuits. The plurality of scan-enabled flip-flop circuits may sequentially output at least a portion of the known scan-chain pattern to the test output interface.

Use of predefined scan-chain patterns that can be loaded into scan-enabled storage circuits concurrently, rather than shifted-in, may increase likelihood of identifying a circuit with a stuck-at fault, thereby enabling an ability to identify faulty circuits at a finer granularity. This ability to identify faulty circuits may allow revisions to an IC design that improve fabrication yields, and thereby, reliability and profitability of end products using the IC.

FIG. 1 illustrates a block diagram of an embodiment of a system that uses scan signature circuits to load predefined scan-chain patterns into scan-enabled storage circuits in a scan chain. System-on-chip (SoC) 100 includes circuit blocks 105a and 105b (collectively 105). Each of circuit blocks 105 includes a plurality of scan-enable flip-flop circuits (scan FF) 120a-120i (collectively 120) and a plurality of scan signature circuits 115a-115d (collectively 115). SoC 100 includes test input interface 150 for receiving scan-chain pattern input and test output interface 152 on which scan-chain pattern output is asserted. Two test signals 130a and 130b are also included. SoC 100 may further be a part of a computing system, such as a desktop or laptop computer, a smartphone, a tablet computer, a wearable smart device, or the like.

As shown, circuit blocks 105 include scan chains 110a and 110b (collectively 110), each of scan chains 110 distributed across both circuit blocks 105. Scan chains 110 include a plurality of scan-enabled flip-flop circuits (scan FFs) 120. Scan chain 110a includes scan-enabled flip-flop circuits 120 a-120d coupled in a sequential manner across circuit blocks 105. In a similar manner, scan chain 110b includes scan-enabled flip-flop circuits 120e-120i, also coupled in a sequential manner across circuit blocks 105. Each of scan chains 110a and 110b is configured to shift a scan-chain test signal from test input interface 150 to test output interface 152.

SoC 100 also includes a plurality of scan signature circuits 115 that are coupled to respective ones of a subset of scan-enabled flip-flop circuits 120. Scan signature circuits 115, as illustrated, are configured to, in response to test signal 130b, concurrently load a known scan-chain pattern to the subset of scan-enabled flip-flop circuits 120. Scan signature circuits 115 may include logic circuitry that causes a given scan signature circuit 115 to assert a particular logic state into an input of a respective one of scan-enabled flip-flop circuits 120.

For example, a particular value of test signal 130b may indicate to scan signature circuits 115d and 115e to load particular logic values into scan-enabled flip-flop circuit 120e and scan-enabled flip-flop circuit 120g, respectively. scan-enabled flip-flop circuits 120 are further configured to sequentially output at least a portion of the known scan-chain pattern to the test output interface. Test signal 130a may be a scan test clock signal that, when active, causes scan-enabled flip-flop circuits 120e-120i in scan chain 110b to shift their respective contents for each active transition of test signal 130a, including the predetermined pattern values loaded into scan-enabled flip-flop circuits 120e and 120g.

An output of scan-enabled flip-flop circuit 120i is, as shown, coupled to test output interface 152, allowing, e.g., test monitoring equipment to observe an output pattern from scan chain 110b. Likewise, similar actions may be performed in order to load a predefined scan-chain pattern into scan-enabled flip-flop circuits 120b, 120c, and 120d and shift output to test output interface 152 for observation. The monitored output from scan-enabled flip-flop circuit 120i or 120d may be compared to expected values by the test monitoring equipment, and discrepancies between the observed and expected patterns may be used to identify, for example, a particular one of scan-enabled flip-flop circuit 120 that is faulty. In some cases, a different value of test signal 130b may be used to cause a different predetermined scan-chain pattern to be loaded into the respective subset of scan-enabled flip-flop circuits 120, such as an inverse of the previous scan-chain pattern. Using an inverse pattern may force the subset of scan-enabled flip-flop circuits 120 to store both high and low logic states in an attempt to detect if any scan-enabled flip-flop circuits 120 have a stuck-at fault. Additional details regarding the predetermined scan-chain patterns will be presented below.

It is noted that SoC 100, as illustrated in FIG. 1, is merely an example. SoC 100 has been simplified to highlight features relevant to this disclosure. Elements not used to describe the details of the disclosed concepts have been omitted. For example, SoC 100 may include various additional circuits that are not illustrated, such as one or more processor circuits, memory management circuits, memory circuits, and the like. Only two scan chains are illustrated with an included nine scan-enabled flip-flop circuits 120 and five scan signature circuits 115. In other embodiments, any suitable number of scan chains may be included, and each scan chain may be comprised of any suitable number of elements, including, e.g., logic elements that are not illustrated. In various embodiments, circuit blocks 105, as well as other circuits of SoC 100 that are not shown, may be implemented using any suitable combination of sequential and combinatorial logic circuits. In addition, register and/or memory circuits, such as static random-access memory (SRAM) may be used in these circuits to temporarily hold information such as instructions, data, address values, and the like.

Figure 2:
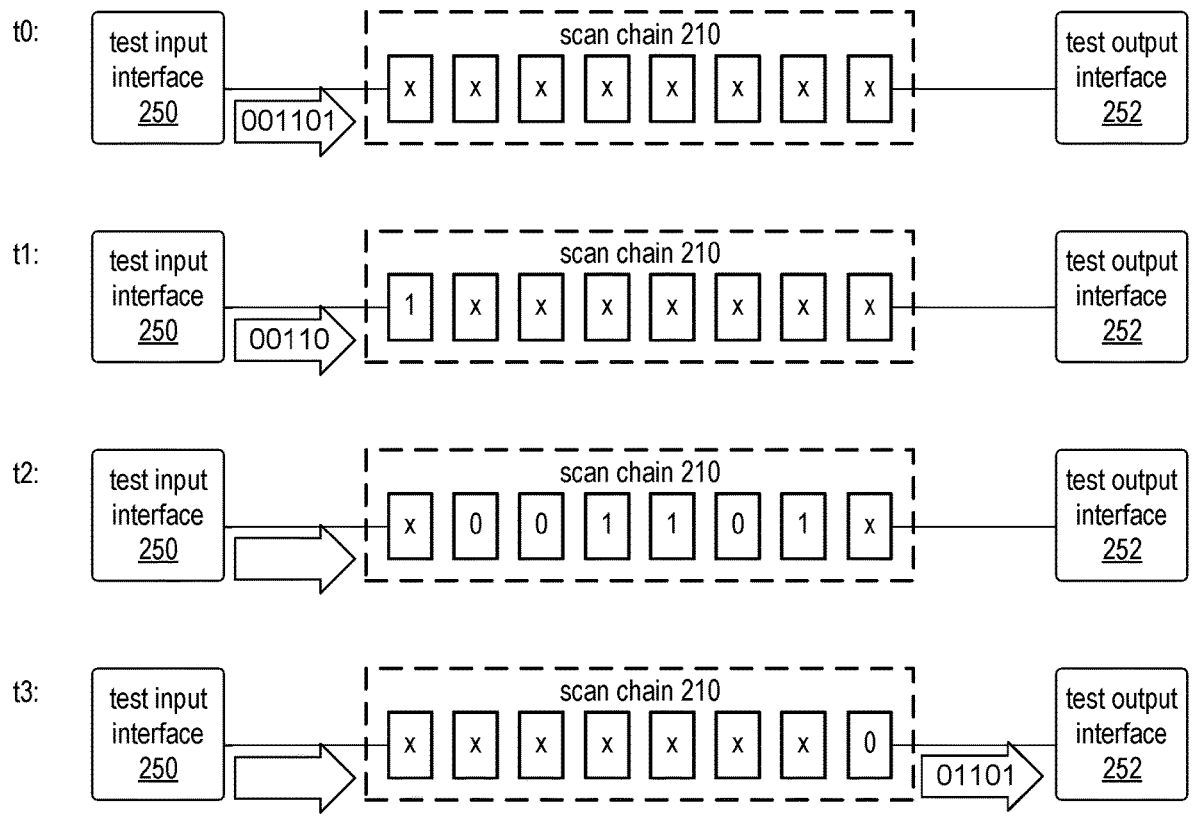
FIG. 2 shows a block diagram of a passing system-on-chip depicting a state of a scan chain at four points in time.
Figure 3:
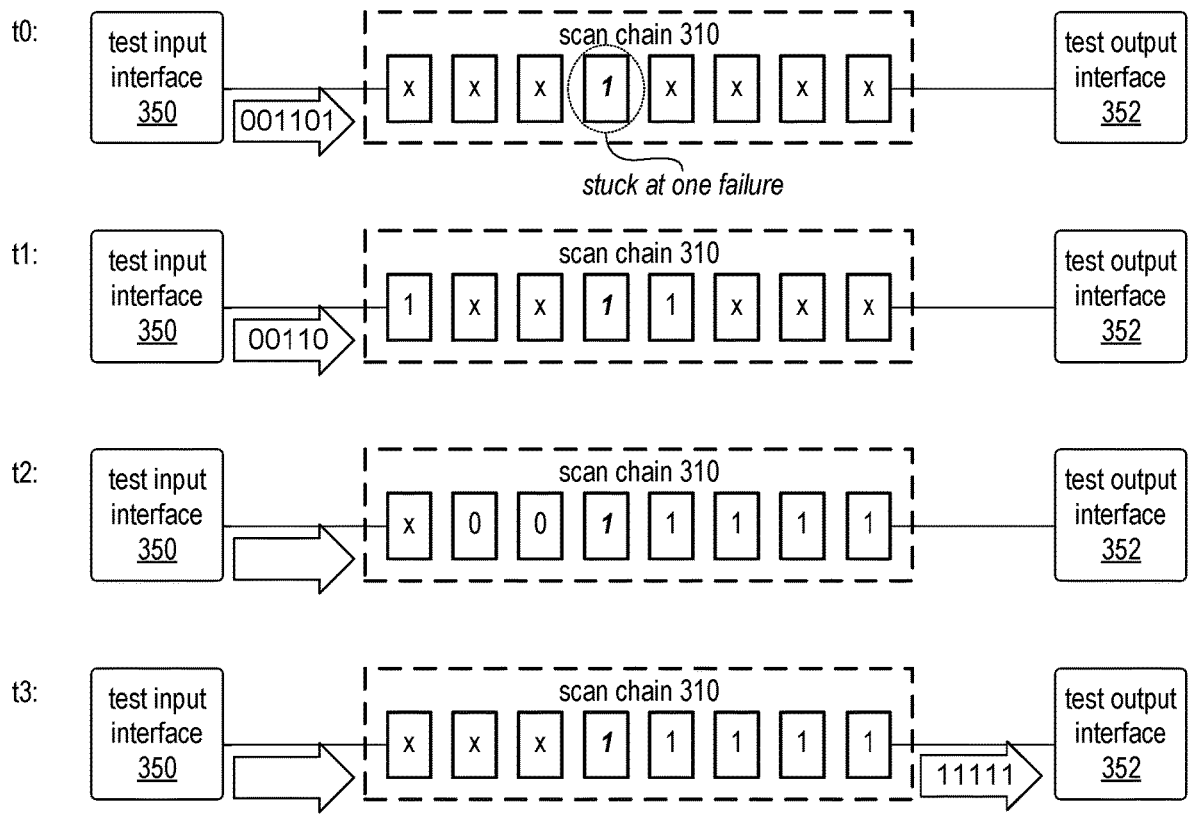
FIG. 3 depicts a block diagram of a failing system-on-chip showing a state of a scan chain at four points in time.

In FIG. 1, scan chains that utilize scan signature circuits are disclosed. Benefits of using scan signature circuits may be understood in view of scan operation. FIGS. 2 and 3 depict scan operations for passing and failing SoCs.

Moving to FIG. 2, a block diagram of a scan chain is shown at four points in time during a scan operation. Passing SoC 200 includes scan chain 210, with a plurality of scan-enabled flip-flop circuits, and coupled to test input interface 250 at one end and to test output interface 252 at the other end. Scan chain 220 is configured to shift a scan-chain pattern from a first scan-enabled flip-flop circuit coupled to test input interface 250 through a sequence of scan-enabled flip-flop circuits until a final scan-enabled flip-flop circuit provides the scan-chain pattern to test output interface 252.

As illustrated at time t0, the scan-enabled flip-flop circuits in scan chain 220 are in an uninitialized state. Test input interface 250 presents a first bit of a scan-chain pattern at an input of scan chain 220. For simplicity, the scan-chain pattern is shown with only six bits of pattern data. In other embodiments, scan-chain patterns may include any suitable number of pattern data bits. A test clock signal may toggle, resulting in, at time t1, a first bit of the scan-chain pattern being latched into the first scan-enabled flip-flop circuit of scan chain 220.

By time t2, the scan-chain pattern has been loaded into scan chain 220 and subsequent transitions of the test clock may cause the loaded pattern to be shifted towards test output interface 252. By time t3, all but one pattern data bit has been shifted out to test output interface 252. It is noted that the present example shows the output scan-chain pattern matching the input scan-chain pattern. In other embodiments, an expected output scan-chain pattern may differ from the input scan-chain pattern due to logic circuits between subsequent scan-enabled flip-flop circuits.

Continuing to FIG. 3, a block diagram of a scan chain is again shown at four points in time during a scan operation, this time for a faulty SoC. Failing SoC 200 includes scan chain 310, with a sequence of scan-enabled flip-flop circuits that are coupled to test input interface 350 at one end and to test output interface 352 at the other end. In the present example, one scan-enabled flip-flop circuit has a stuck at one fault, as indicated.

As illustrated at time t0, the same scan-chain pattern is ready to be loaded into scan chain 310. At time t1, a first bit of the scan-chain pattern is shifted into scan chain 310. It is noted, however, that due to the stuck at one fault, an erroneous logic one value is shifted into a scan-enabled flip-flop circuit that is adjacent and downstream from the faulty scan-enabled flip-flop circuit. It is noted that, as used herein, "downstream" refers to scan-enabled flip-flop circuits that lie between a given scan-enabled flip-flop circuit and the test output interface. Conversely, "upstream" refers to scan-enabled flip-flop circuits that lie between the test input interface and the given scan-enabled flip-flop circuit.

As the scan-chain pattern continues to be shifted trough scan chain 310 at time t2, the scan-chain pattern is corrupted at the faulty scan-enabled flip-flop circuit, and all scan-enabled flip-flop circuits downstream from the faulty scan-enabled flip-flop circuit have logic one values shifted-in. At time t3, test output interface 352 simply receives a string of logic one values rather than the expected output pattern. Analysis of the received output scan-chain pattern doesn't provide an indication of which of the scan-enabled flip-flop circuits is faulty since the input scan-chain pattern has to be loaded from the first scan-enabled flip-flop circuit that is coupled to the test input interface.

Figure 4:
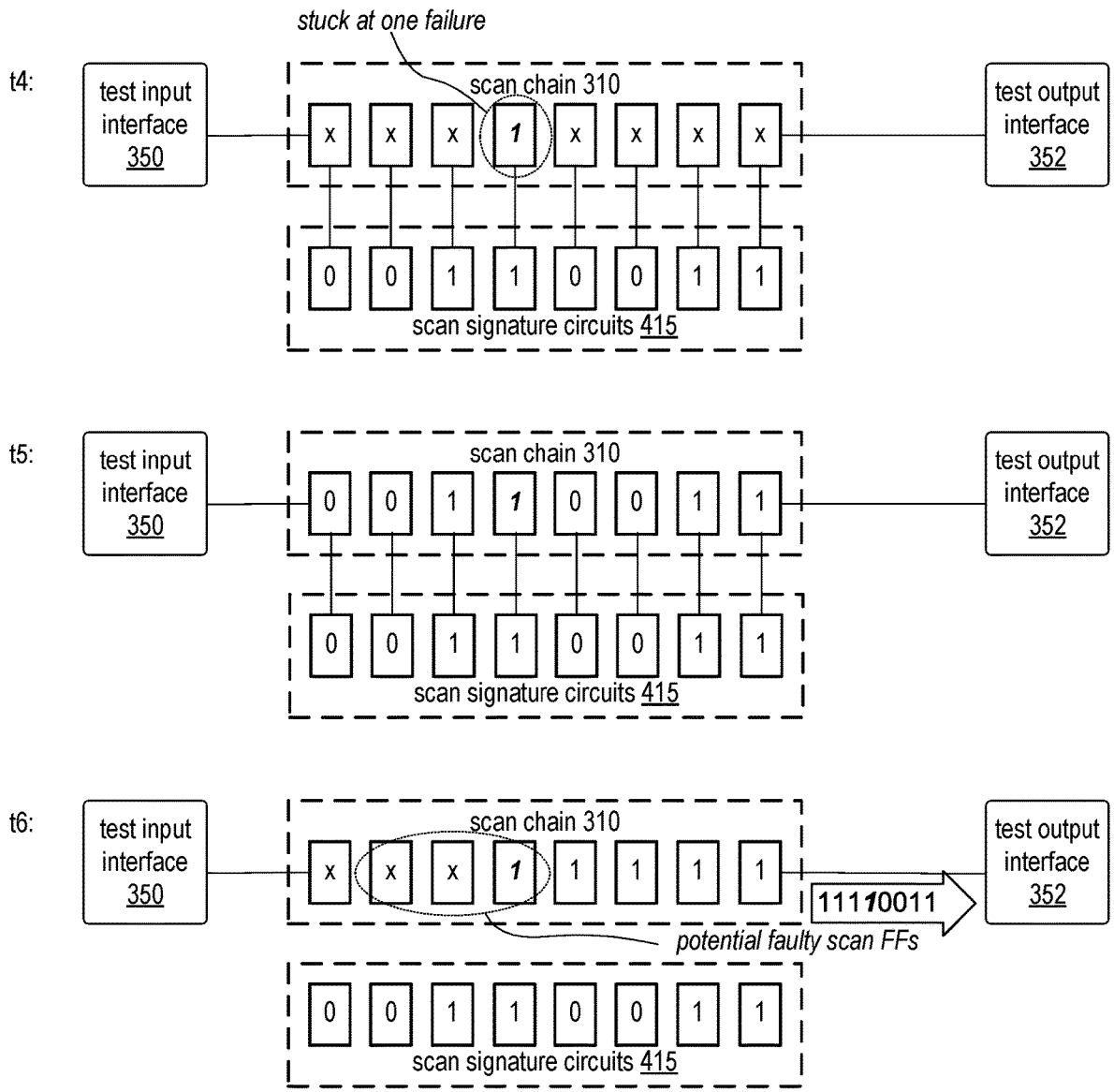
FIG. 4 illustrates a block diagram of an embodiment of a failing system-on-chip that includes scan signature circuits, showing a state of a scan chain at three points in time.
Figure 5:
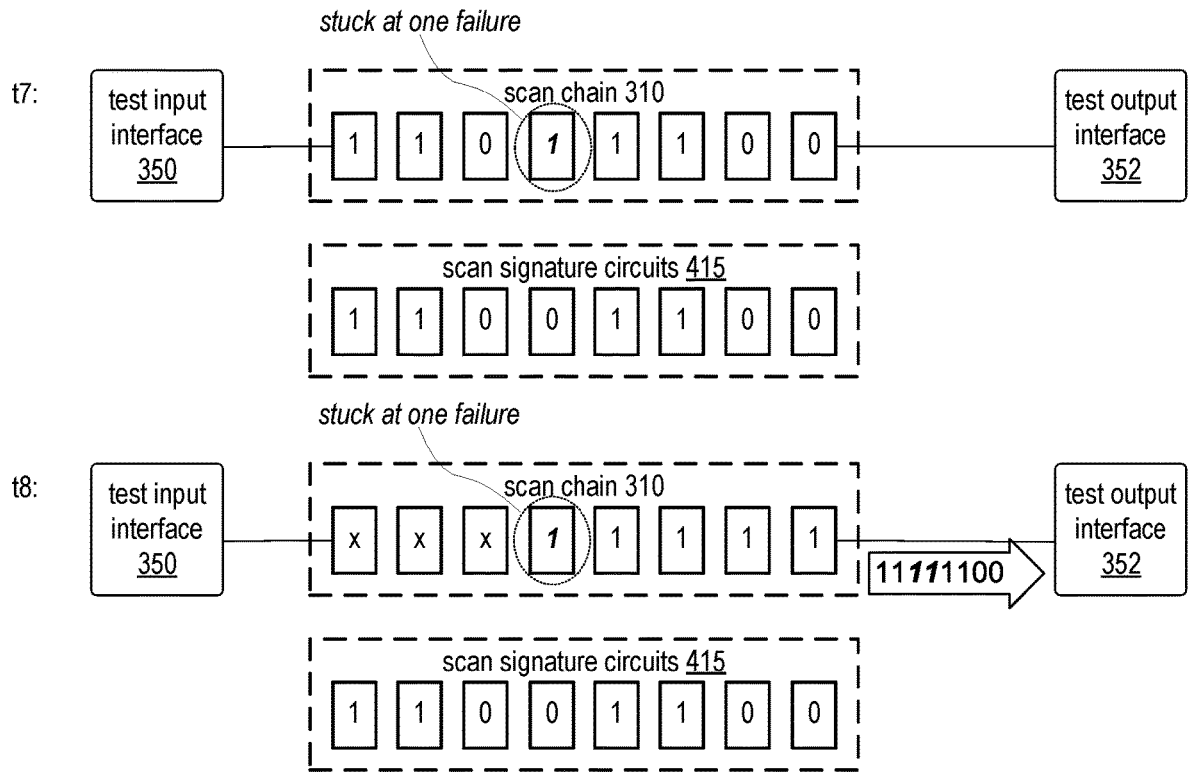
FIG. 5 shows a block diagram of an embodiment of a failing system-on-chip that includes scan signature circuits, showing a state of a scan chain at two points in time.

The descriptions related to FIGS. 2 and 3 disclose scan chain operation without a benefit of scan signature circuits. Use of scan signature circuits may provide an ability to identify a faulty scan-enabled flip-flop circuit without resorting to other expensive, time-consuming extraneous techniques. FIGS. 4 and 5 provide examples of use of scan signature circuits.

Proceeding to FIG. 4, another block diagram of the embodiment of failing SoC 300 is illustrated. As shown, SoC 300 includes scan chain 310 as well as scan signature circuits 415. FIG. 4 depicts three additional points in time after time t3 in FIG. 3, during which scan signature circuits 415 are used to aid in identifying the faulty scan-enabled flip-flop circuit.

As illustrated at time t4, scan signature circuits 415 are configured to concurrently load a known scan-chain pattern to the scan-enabled flip-flop circuits in scan chain 310. This may be performed, for example, in response to a particular test signal, such as test signal 130b in FIG. 1. To concurrently load the known scan-chain pattern, scan signature circuits 415 are further configured to set the respective ones of the scan-enabled flip-flop circuits to a particular logic state, as shown at time t5. For example, scan signature circuits 415 may shift a corresponding portion (e.g., one pattern bit) of the known scan-chain pattern into a scan input node of respective ones of the scan-enabled flip-flop circuits of scan chain 310. In other embodiments, a first one of scan signature circuits 415 may assert a set node of a respective one of the scan-enabled flip-flop circuits, while a second scan signature circuit asserts a reset node of a different one of the subset of scan-enabled flip-flop circuits.

In some embodiments, scan signature circuits 415 are configured to select, based on a value of test signal 130b, one of a plurality of known scan-chain patterns to concurrently load into the subset of the scan-enabled flip-flop circuits. As illustrated, a first pattern of the plurality of known scan-chain patterns may be a repetitive pattern of a particular sequence of high and low logic states. In this case, the repetitive pattern is, going from right to left as test output interface 352 would receive the pattern data bits, two high states followed by two low states. Scan signature circuits 415 may, as a group, be configured any suitable number of other patterns as is suitable for analyzing scan chain 310.

At time t6, a functioning portion of the scan-enabled flip-flop circuits of scan chain 310 may be further configured to sequentially output at least a portion of the known scan-chain pattern to test output interface 352. This functioning portion of scan chain 310 includes ones of the scan-enabled flip-flop circuits arranged between the failing scan-enabled flip-flop circuit and test output interface 352. Although a second portion of scan-enabled flip-flop circuits that are arrange between test input interface 350 and the failing scan-enabled flip-flop circuit may be functional, the failing scan-enabled flip-flop circuit prevents propagation of the loaded known scan-chain pattern to test output interface 352. Accordingly, this second portion may not be considered part of the functioning portion of scan chain 310.

Test output interface 352 receives the output from scan chain 310. As shown, the received scan-chain pattern output matches the expected output (in this case, what is loaded into scan chain 310 at time t5), except for the last two (left-most) pattern data bits which are logic ones instead of the expected logic zeroes. Based on this information, it may be determined that at least one of the three circled scan-enabled flip-flop circuits is the faulty flip-flop circuit. At least one additional scan-chain pattern, however, may be used to narrow down which scan-enabled flip-flop circuit is faulty.

Turning to FIG. 5, two more points in time after time t6 in FIG. 4 are illustrated for scan chain 310 and scan signature circuits 415. During these two additional points in time, a second known scan-chain pattern scan pattern is used with scan signature circuits 415 to aid in identifying the faulty scan-enabled flip-flop circuit.

As shown at time t7, a second pattern of the plurality of known scan-chain patterns is loaded into scan chain 310. This second pattern is different from the first pattern shown in FIG. 4. As depicted, this second known scan-chain pattern is an inverse of the first pattern.

At time t8, the functioning portion of the scan-enabled flip-flop circuits of scan chain 310 may be further configured to sequentially output at least a portion of the second scan-chain pattern to test output interface 352. Test output interface 352 receives the second output from scan chain 310. In the present example, the received scan-chain pattern output matches the expected output (what is loaded into scan chain 310 at time t7), except for the two bold and italicized pattern data bits which are logic ones instead of the expected logic zeroes.

Based on the output when using the first pattern and this additional output using the second pattern, the faulty flip-flop circuit may be identified. The combination of the two received output patterns may only be possible when the circled scan-enabled flip-flop circuit has a stuck at one fault. It may not, however, be possible to determine if any of the scan-enabled flip-flop circuits that are upstream from the faulty scan-enabled flip-flop circuit are also faulty. Details describing how the upstream flip-flop circuits may also be tested are provided below.

Figure 6:
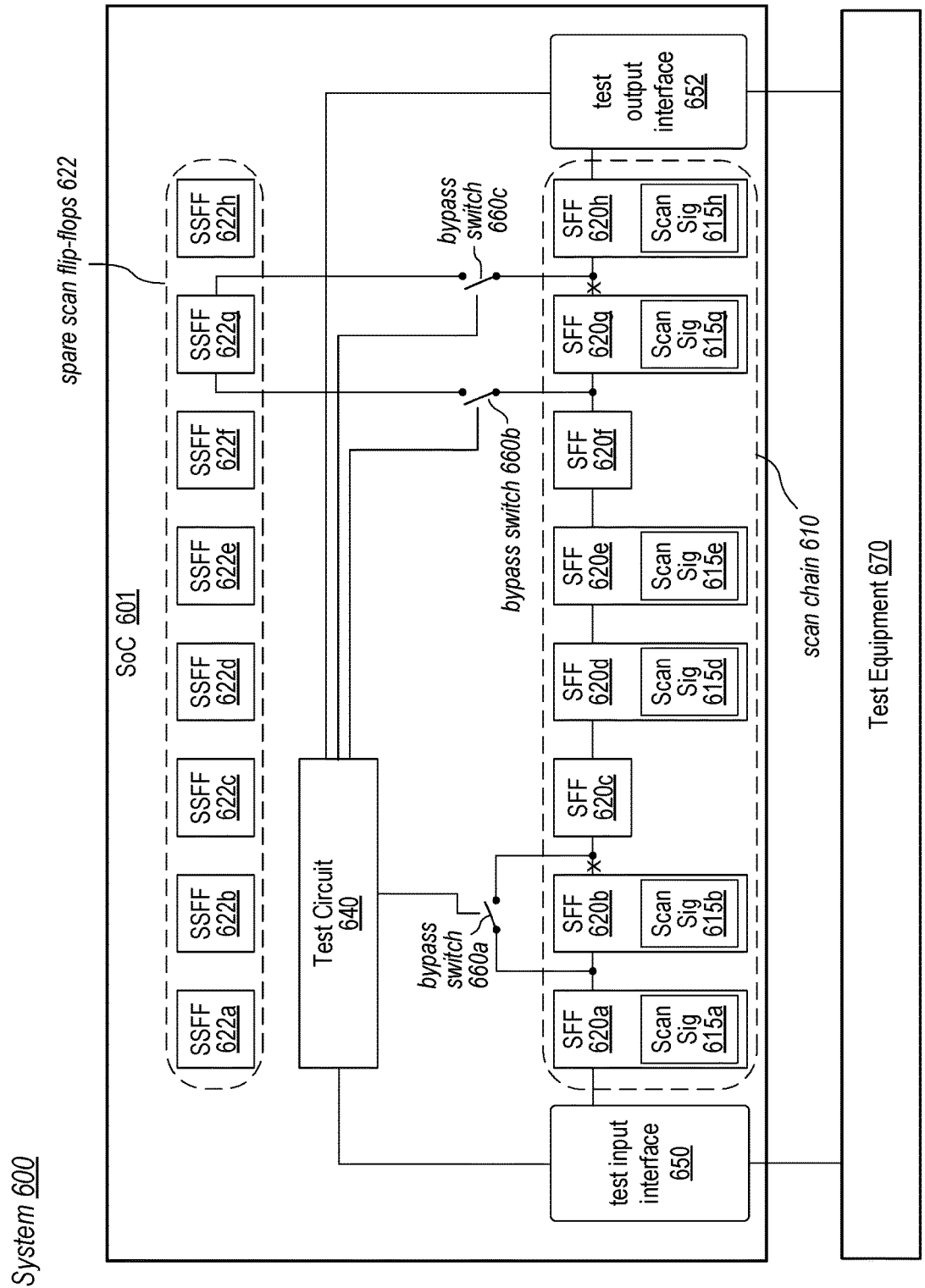
FIG. 6 depicts a block diagram of an embodiment of system for scan testing a system-on-chip that includes a scan chain with scan signature circuits as well as spare scan-enabled flip-flop circuits.

It is noted that FIGS. 2-5 are merely examples to demonstrate the disclosed concepts. Although a single scan chain is shown, any suitable number of scan chains may be included in a given SoC and, similarly, any suitable number of included scan chains may be enabled and active for a given scan operation The descriptions related to FIGS. 4 and 5 disclose use of scan signature circuits to identify at least a first faulty scan-enable flip-flop circuit. Additional techniques may be utilized in order to identify whether any scan-enable flip-flop circuits upstream from the faulty flip-flop circuit are also faulty. FIG. 6 illustrates one such technique.

Proceeding now to FIG. 6, a block diagram of an embodiment of a system that uses scan signature circuits to identify a faulty scan-enabled storage circuit and enable an alternate path around the faulty scan-enabled storage circuit. As shown, system 600 includes SoC 601 that further includes scan chain 610 that includes scan-enabled flip-flop circuits 620a-620h (collectively 620). A subset of scan-enabled flip-flop circuits 620 include a respective one of scan signature circuits 615a-615h (collectively 615). Scan-enabled flip-flop circuits 620c and 620 do not include scan signature circuits while the remaining ones of scan-enabled flip-flop circuits 620 do. SoC 601 also includes spare scan-enabled flip-flop circuits 622a-622h (collectively 622). Several bypass switches 660a-660c are shown coupled to particular ones of scan-enabled flip-flop circuits 620. SoC 601 further includes test circuit 640 that is coupled to test input interface 650 and test output interface 652. SoC 601 is coupled, via test input interface 650 and test output interface 652, to test equipment 670.

As illustrated, test equipment 670 is configured to assert input signals to a device under test (DUT), and monitor output signals from the DUT. In various embodiments, test equipment 670 may be automated test equipment used in a production manufacturing process, evaluation equipment in a research or failure analysis lab, SoCs included with the DUT in a product (e.g., a desktop or laptop computer, a smartphone, tablet, wearable computer device, etc.), and the like. SoC 601 may be coupled to test equipment 670 in as part of a production test process, a lab evaluation, a field debugging session, and so forth.

SoC 601 includes a plurality of scan chains, such as scan chain 610. SoC 601 may be configured to receive, from test equipment 670, a first scan-chain pattern at test input interface 650 for scan chain 610, and to send, back to test equipment 670, a response to the first scan-chain pattern at test output interface 652. Test circuit 640 may be configured to generate appropriate signals to scan-enabled flip-flop circuits 620 to cause the first scan chain pattern to be shifted through scan chain 610. Test equipment 670 may be further configured to send, in response to a determination that the response does not match an expected response, a particular test signal to SoC 601. SoC 601 may, in response to the particular test signal, concurrently load a known scan-chain pattern to a subset of scan-enabled flip-flop circuits 620 included in scan chain 610. As shown, scan-enabled flip-flop circuits 620a, 620b, 620d, 620c, 620g, and 620h each include a respective one of scan signature circuits 615a, 615b, 615d, 615e, 615g, and 615h. As described above, scan signature circuits 615 may be configured to, in response to one or more particular test signals from test circuit 640, cause one of one or more known scan chain patterns to be loaded into the corresponding scan-enabled flip-flop circuits 620. SoC 601 then send, to test equipment 670, a response to the known scan-chain pattern at test output interface 652.

As illustrated, test circuit 640 may be configured to identify a failing one of the plurality of scan-enabled flip-flop circuits 620. In some embodiments, the identification may be performed by test equipment 670 alone or in combination with test circuit 640. For example, scan-enabled flip-flop circuit 620b may have a stuck-at fault. Due to the faulty scan-enabled flip-flop circuit 620b, scan-enabled flip-flop circuit 620a may not be capable of being tested since output from scan-enabled flip-flop circuit 620a cannot pass through scan-enabled flip-flop circuit 620b. SoC 601, as shown, is configured to enable an alternate scan chain path that avoids the failing scan-enabled flip-flop circuit in the scan chain. SoC 601 includes bypass switch 660a that may allow scan chain patterns to be routed around the faulty scan-enabled flip-flop circuit 620b, e.g., forming an alternate scan chain path. As illustrated, test circuit 640 may be capable of enabling bypass switch 660a in response to the determination that scan-enabled flip-flop circuit 620b is faulty, thereby enabling a scan-chain path around scan-enabled flip-flop circuit 620b. When bypass switch 660a is closed, an alternate path is created that couples an input node of faulty scan-enabled flip-flop circuit 620b to an output node of scan-enabled flip-flop circuit 620b, thereby allowing scan-enabled flip-flop circuit 620*a* to be tested by bypassing the faulty scan-enabled flip-flop circuit 620*b* and send signals directly to scan-enabled flip-flop circuit 620*c*. Bypass switches may be implemented using any suitable type of switching circuit, including for example, an n-channel or p-channel metal-oxide-semiconductor field-effect transistor (MOSFET).

In some embodiments, rather than bypassing a faulty scan-enabled flip-flop circuit, bypass switches may be used to "repair" a faulty scan-enabled flip-flop circuit by routing signals to and from a spare flip-flop circuit in place of the faulty scan-enabled flip-flop circuit. As an example, scan-enabled flip-flop circuit 620*g* may be determined to be faulty. To perform a repair of faulty scan-enabled flip-flop circuit 620*g*, test circuit 640 may be configured to activate bypass switch 660*b* to route an input node of faulty scan-enabled flip-flop circuit 620*g* to an input node of a spare scan-enabled flip-flop circuit 622*g* and to activate bypass switch 660*c* to route an output node of spare scan-enabled flip-flop circuit 622*g* to an output node of faulty scan-enabled flip-flop circuit 620*g*. In some embodiments, another switch may be activated to decouple the output of faulty scan-enabled flip-flop circuit 620*g* from an input node of scan-enabled flip-flop circuit 620*h*, thereby allowing the output of spare scan-enabled flip-flop circuit 622*g* to drive the input of scan-enabled flip-flop circuit 620*h*.

In various embodiments, the activation of one or more of bypass switches 660 may be temporary, for example, activated by a signal asserted by test circuit 640 only for as long as test circuit 640 asserts the signal. Such embodiments may enable improved scan test coverage in SoCs with one or more faulty scan-enabled flip-flop circuits. In other embodiments, a non-volatile storage element (e.g., flash memory, fuses and the like) may be used with spare scan-enabled flip-flop circuits to enable a more permanent repair of faulty scan-enabled flip-flop circuits. Bypass switches 660 may be implemented using any suitable type of switch circuit, such as a metal-oxide-semiconductor field-effect transistor (MOSFET), a programmable logic array, fuses, and the like.

It is noted that the embodiment of FIG. 6 is an example for demonstrative purpose. Only a few bypass switches and a single scan chain are illustrated for clarity. In other embodiments, any suitable number of bypass switches, spare scan-enabled flip-flop circuits, scan chains, etc. may be included.

In the embodiments described in FIGS. 1-6, the scan chains are illustrated as being independent from one another. An output signal from a flip-flop circuit of one scan chain is not shown to fan-out to one or more input nodes in other scan chains. In some SoC designs, however, scan chains may fan-out such that an output node of an intermediate flip-flop circuit of a first scan chain may be coupled to input nodes of one or more flip-flop circuits of other scan chains. Such an example is shown in FIG. 7.

Figure 7:
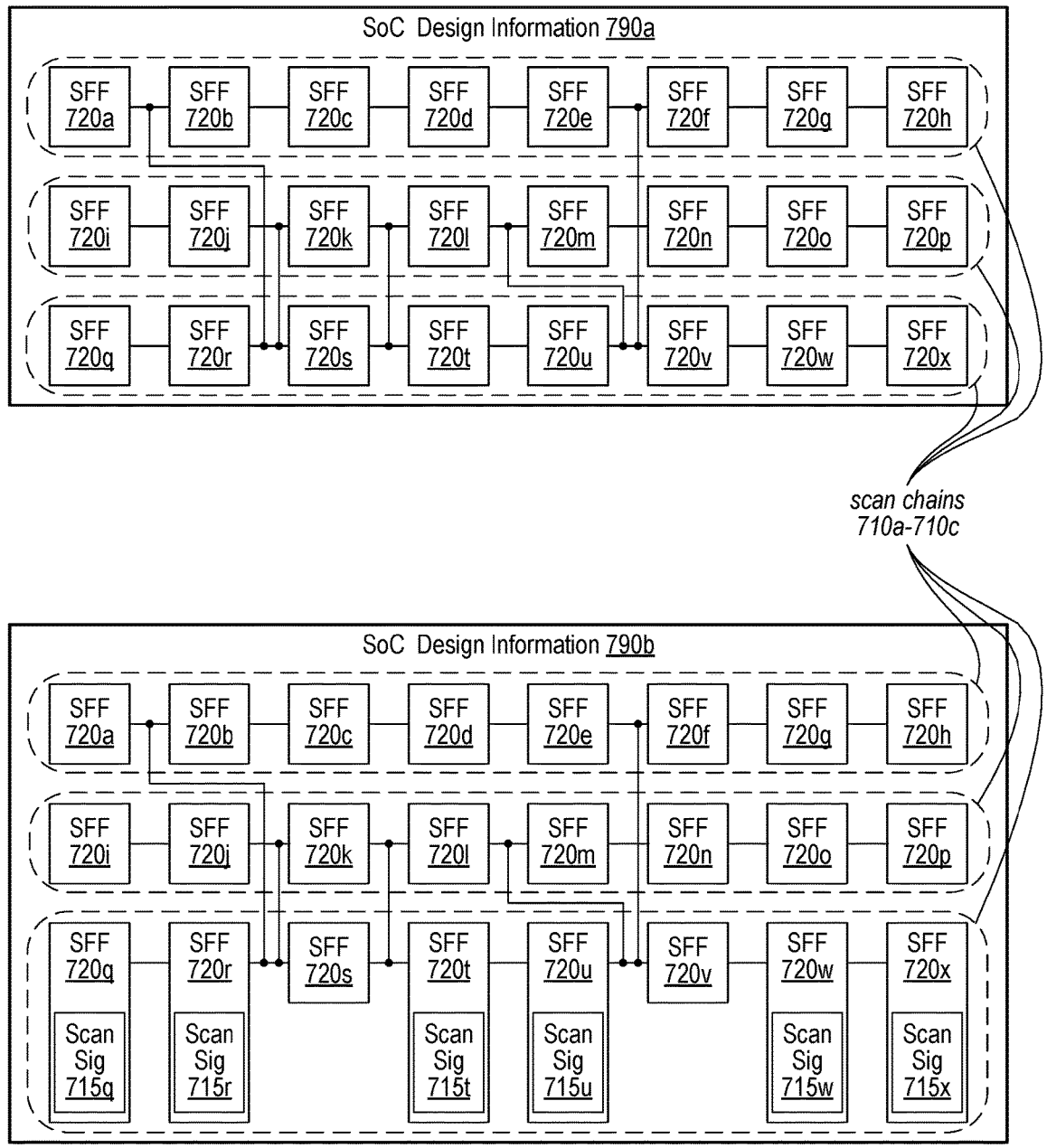
FIG. 7 shows a block diagram of an embodiment of computer system for designing a system-on-chip that includes a scan chain with scan signature circuits.

Moving to FIG. 7, a block diagram of an embodiment of a computer system for designing SoCs is depicted. Computer system 700 is shown with two versions of SoC design information, 790*a* and 790*b*. SoC design information 790*a* represents design information for an SoC prior to adding scan signature circuits. SoC design information 790*b* represents design information for the same SoC after scan signature circuits have been added to a scan chain. Computer system 700 may be implemented using a desktop or laptop computer system, one or more server computer systems, a virtual computer running across a plurality of computer systems, and the like. SoC design information 790*a* and 790*b* may, in some embodiments, be stored in a computer-readable, non-transitory storage medium. SoC design information 790 specifies a design of at least a portion of a hardware integrated circuit in a format recognized by a semiconductor manufacturing system that is configured to use the design information to produce the hardware integrated circuit according to SoC design information 790.

A design engineer or team of design engineers may design a new SoC by creating SoC design information 790*a* using any suitable set of integrated circuit design tools running on computer system 700. SoC design information 790*a*, as shown, specifies that the hardware integrated circuit comprises a plurality of circuit blocks, such as one or more processor circuits, graphics and audio processor circuits, networking circuits, timer circuits, memory arrays and memory controller circuits, and other types of circuits that may be included on various types of SoCs.

At a certain point (or in some case at various points) in the design of the new SoC, scan-enabled flip-flop circuits 720*a*-720*x* (collectively 720) for scan chains 710*a*-710*c* may be inserted into the integrated circuit design information, creating in SoC design information 790*a*. As used herein, "inserting" circuit elements such as scan-enabled flip-flop circuits refers to adding the circuit elements into particular locations (e.g., coupled to particular circuits already included in the design). In some cases, insertion of a circuit element into existing design information may include adding one or more line of register-transfer language (RTL) into the design information. Scan-enabled flip-flop circuits, as shown, form scan chains 710*a*-710*c* across the plurality of circuit blocks, and may be configured to shift a scan chain test signal from a test input interface to a test output interface, in a similar manner as described above for FIG. 1. Scan chain 710*a* includes scan-enabled flip-flop circuits 720*a*-720*h*, scan chain 710*b* includes scan-enabled flip-flop circuits 720*i*-720*p*, and scan chain 710*c* includes scan-enabled flip-flop circuits 720*q*-720*x*.

After scan-enabled flip-flop circuits 720 have been added, a portion of scan-enabled flip-flop circuits 720*q*-720*x* in scan chain 710*c* may be identified. This portion includes scan-enabled flip-flop circuits 720*s* and 720*v* that receive a respective scan data signal that is based on signals from the other scan chains 710*a* and 710*b*. In some embodiments, scan-enabled flip-flop circuits 720*s* and 720*v* may be identified because they receive respective data input signals that are derived from a threshold number of the plurality of scan chains. For example, scan-enabled flip-flop circuits 720 that receive data input signals from two or more other scan chains may be included in the identified portion. Receiving data input signals from a threshold number of other scan chains is referred to herein as "high fan-in." A scan-enabled flip-flop circuit with high fan-in has an input signal that is comprised of a plurality of scan chains. Accordingly, if a scan-enabled flip-flop circuit with high fan-in is faulty, then there may be one or more other scan-chain paths for the data signal going into the faulty scan-enabled flip-flop circuit to travel. Scan-enabled flip-flop circuits with high fan-in may, in some cases, be identified without having to utilize a scan signature circuit.

The design of the new SoC may include inserting a set of scan signature circuits 715*q*-715*x* (collectively 715) into respective ones of a subset of scan-enabled flip-flop circuits 720*q*-720*x* in scan chain 710*c*, thereby creating SoC design information 790*b*. The subset includes all of the plurality of scan-enabled flip-flop circuits 720*q*-720*x* except for scan-enabled flip-flop circuits 720*s* and 720*v* that are in the identified portion. Since scan-enabled flip-flop circuits 720*s* and 720*v* have high fan-in, corresponding scan signature circuits may not be as valuable for identifying when these two scan-enabled flip-flop circuits are faulty. Omitting scan signature circuits from scan-enabled flip-flop circuits 720s and 720v may reduce die area, as well as power consumption. This omission may also reduce complexity of SoC design information 790b which, in turn, may simplify other design tasks such as timing analysis.

In the illustrated embodiment, scan signature circuits 715 are included within the respective ones of the subset of scan-enabled flip-flop circuits 720q-720x. For example, design information for scan-enabled flip-flop circuits 720q, 720r, 720t, 720u, 720w, and 720x may be replaced with a scan-enabled flip-flop circuit design that includes a respective scan signature circuit. In other embodiments, scan signature circuits 715 are included in separate design information that is then coupled to respective ones of the plurality of scan-enabled flip-flop circuits that are excluded from the identified portion of scan-enabled flip-flop circuits 720.

The generated SoC design information 790b specifies the hardware integrated circuit of SoC design information 790a, with the addition of scan signature circuits 715, that are included in respective ones of the subset of scan-enabled flip-flop circuits 720q-720x. As described above, scan signature circuits 715 are configured to concurrently load, in response to a particular signal, a known scan-chain pattern to respective ones of the subset of scan-enabled flip-flop circuits 720q-720x.

It is noted that the embodiment of FIG. 7 is an example for demonstrating the disclosed techniques. Many elements that may be included in an SoC design have been omitted for clarity. For example, various circuit blocks such as processor circuits, networking circuits, memory circuits, test interfaces, and the like have been left out of FIG. 7, but may be included in other embodiments.

To summarize, various embodiments of a system that utilizes a prefetch deny list circuit are disclosed. In an example apparatus, a plurality of circuit blocks, a plurality of scan-enabled flip-flop circuits, and a plurality of scan signature circuits are included in an integrated circuit. The plurality of scan-enabled flip-flop circuits may be coupled in a sequential manner across the plurality of circuit blocks, and be configured to shift a scan chain test signal from a test input interface to a test output interface. The plurality of scan signature circuits may be coupled to respective ones of a subset of the plurality of scan-enabled flip-flop circuits, and be configured to, in response to a particular test signal, concurrently load a known scan-chain pattern to the subset of the scan-enabled flip-flop circuits. The plurality of scan-enabled flip-flop circuits may be further configured to sequentially output at least a portion of the known scan-chain pattern to the test output interface.

In a further example, to concurrently load the known scan-chain pattern, the plurality of scan signature circuits may be configured to set the respective ones of the subset of scan-enabled flip-flop circuits to a particular logic state. In an example, the plurality of scan signature circuits may be further configured to concurrently load a selected one of a plurality of known scan-chain patterns to the subset of the scan-enabled flip-flop circuits based on a value of the particular test signal.

In another example, a first pattern of the plurality of known scan-chain patterns may be a repetitive pattern of a particular sequence of high and low logic states. In an example, a first pattern of the plurality of known scan-chain patterns may be an inverse of a second pattern of the plurality of known scan-chain patterns.

In a further example, a given scan-enabled flip-flop circuit may be configured to receive a data input signal that is derived based on a plurality of logic paths that include respective scan-enabled flip-flop circuits. The given scan-enabled flip-flop circuit may be excluded from coupling to a respective scan signature circuit In another example, the apparatus may further include a test circuit that is configured to identify a failing one of the plurality of scan-enabled flip-flop circuits, and to enable an alternate scan chain path that avoids the failing scan-enabled flip-flop circuit in the scan chain. In an example, the plurality of scan signature circuits may be included within the respective ones of the subset of the plurality of scan-enabled flip-flop circuits.

The circuits and techniques described above in regards to FIGS. 1-7 may be performed using a variety of methods. Two methods associated with using scan signature circuits are described below in regards to FIGS. 8 and 9.

Turning now to FIG. 8, a flow diagram for an embodiment of a method for performing a scan test using a plurality of scan signature circuits is illustrated. Method 800 may be performed by any of the systems disclosed herein, such as SoCs 100-300 and 601 of FIGS. 1-6. In some embodiments, some or all of the operations of method 800 may be performed using instructions included in a non-transient, computer-readable memory having program, the instructions being executable by ones of SoCs 100-300 and 601 to cause the operations described with reference to FIG. 8. Method 800 is described below using SoC 100 of FIG. 1 as an example. References to elements in FIG. 1 are included as non-limiting examples.

At 810, method 800 begins by shifting, by a scan chain that includes a plurality of scan-enabled flip-flop circuits, a scan-chain pattern from an input port of a test interface of an integrated circuit to an output port of the test interface. For example, a scan-chain pattern is received by SoC 100 at test input interface 150 and is shifted through scan-enabled flip-flop circuits 120e-120i included in scan chain 130b to test output interface 152. In the present example, at least one of scan-enabled flip-flop circuits 120e-120i fails to shift the scan-chain pattern. For example, scan-enabled flip-flop circuit 120f may have a stuck-at fault.

Method 800 continues at 820 by, after the scan-chain pattern fails to be shifted to the output port, concurrently loading, by a plurality of scan signature circuits that are coupled to respective ones of a subset of the plurality of scan-enabled flip-flop circuits, a known scan-chain pattern to the subset of the scan-enabled flip-flop circuits. The scan-chain pattern output that is presented at test output interface 152 may include one or more pattern bits that match an expected output pattern and at least a portion of the output pattern that does not match the expected output pattern. In the present example, it may not be possible to identify which of scan-enabled flip-flop circuits 120e-120i is faulty. Accordingly, scan signature circuits 115d and 115e may be used to insert a known pattern into a subset of scan-enabled flip-flop circuits 120e-120i fails in scan chain 110b. As shown, scan signature circuits 115d and 115e may concurrently load the known pattern into scan-enabled flip-flop circuits 120e and 120g respectively. E.g., concurrently loading the known scan-chain pattern may include setting, by scan signature circuit 115d, scan-enabled flip-flop circuit 120e to a first logic state while second scan signature circuit 115e sets scan-enabled flip-flop circuit 120g to a second logic state. In some embodiments, scan signature circuits 115*d* and 115*e* may be configured to load one of a plurality of known scan-chain patterns, based on particular test signals.

At 830 method 800 proceeds with shifting, by a functioning portion of the scan chain, at least a portion of the known scan-chain pattern to the output port. For example, if scan-enabled flip-flop circuit 120*f* is faulty, then the functioning portion of scan chain 110*b* includes scan-enabled flip-flop circuits 120*g*-120*i* that are arranged between the failing scan-enabled flip-flop circuit 120*f* and test output interface 152. The portion of the known scan-chain pattern that was loaded into one or more of scan-enabled flip-flop circuits 120*g*-120*i* may be presented correctly at test output interface 152. At least some of the remaining pattern bits of the known scan-chain pattern may not be presented correctly.

Accordingly, use of scan signature circuits 115 may help to identify a faulty one of scan-enabled flip-flop circuits 120*e*-120*i*. In the present example, scan-enabled flip-flop circuits 120*g*-120*i* may be determined to be functioning, narrowing down the faulty portion of scan chain 110*b* to one or more of scan-enabled flip-flop circuits 120*e* and 120*f*. Having a capability to narrow down an identity of a faulty scan-enabled flip-flop circuit in a scan chain may improve an ability to identify design weaknesses in order than a design change may be implemented to improve functionality and/or reliability of an integrated circuit. In some embodiments, identifying a faulty scan-enabled flip-flop circuit may allow the faulty scan-enabled flip-flop circuit to be replaced with a spare flip-flop circuit such that the integrated circuit may continue to be used.

It is noted that the method of FIG. 8 includes blocks 810-830. Method 800 may end in block 830 or may repeat some or all blocks of the method. For example, method 800 may repeat blocks 820 and 830 to rescan scan chain 110*b* with different known scan-chain patterns. In some cases, method 800, or a portion thereof, may be performed concurrently with other instantiations of the method. For example, scan chains 110*a* and 110*b* in FIG. 1 may be coupled to different pins in test input interface 150 and test output interface 152, thereby allowing respective scan-chain patterns to be shifted concurrently.

Proceeding now to FIG. 9, a flow diagram for another embodiment of a method for performing a scan test using a plurality of scan signature circuits is illustrated. Similar to method 800, method 900 may be used in conjunction with any of the systems disclosed herein, such as SoCs 100-300 and 601. Some or all of the operations of method 900 may, in some embodiments, be performed using instructions stored in a non-transient, computer-readable memory that are executable by ones of SoCs 100-300 and 601 to cause the operations described with reference to FIG. 9. Method 900 is described below using system 600 of FIG. 6 as an example. References to elements in FIG. 6 are included as non-limiting examples. Method 900 may, in some embodiments, be performed after method 800 has been performed.

Method 900 begins in 910 with, after shifting at least a portion of a known scan-chain pattern to an output port, concurrently loading, by a plurality of scan signature circuits, an inverse of the known scan-chain pattern to a subset of scan-enabled flip-flop circuits. As shown, method 900 is performed after the known scan-chain pattern has been shifted to test output interface 652 using, for example, an embodiment of method 800. A given one of scan-enabled flip-flop circuits 620*a*-620*h*, e.g., scan-enabled flip-flop circuit 620*b*, is faulty. The known scan-chain pattern, however, may only narrow down which of scan-enabled flip-flop circuits 620*a*-620*h* is faulty, but may not be usable to identify scan-enabled flip-flop circuit 620*b* specifically. Accordingly, a second known scan-chain pattern is loaded into the subset of scan-enabled flip-flop circuits 620*a*-620*h* that are coupled to respective ones of scan signature circuits 615. Test circuit 640, in some embodiments, may send appropriate signals to scan signature circuits 615 to cause the second scan-chain pattern to be loaded. To identify which scan-enabled flip-flop circuit is faulty, the second scan-chain pattern is an inverse of the known pattern used when method 800 was performed.

At 920, method 900 proceeds with shifting, by the functioning portion of the scan chain, at least a portion of the inverse of the known scan-chain pattern to the output port. After the second scan-chain pattern has been loaded, it is shifted out via the function portion of scan chain 610, e.g., through scan-enabled flip-flop circuits 620*e*-620*h*. The second scan-chain pattern is presented at test output interface 652. Test equipment 670, in some embodiments, may receive the second scan-chain pattern output.

Method 900 continues at 930 with identifying, by a test circuit, a failing one of the plurality of scan-enabled flip-flop circuits. In various embodiments, test circuit 640, test equipment 670, or a combination thereof, may receive and analyze the second scan-chain pattern output from test output interface 652. By analyzing both the first and second scan-chain pattern outputs, test circuit 640 (or test equipment 670) may be capable of identifying scan-enabled flip-flop circuit 620*b* as the faulty scan-enabled flip-flop circuit, for example, using techniques such as described above in regards to FIGS. 4 and 5.

At 940, method 900 proceeds by enabling, by the test circuit, an alternate scan chain path that avoids the failing scan-enabled flip-flop circuit in the scan chain. For example, enabling the alternate scan chain path may include enabling bypass switch 660*a* to route an input node of scan-enabled flip-flop circuit 620*b* to an output node of scan-enabled flip-flop circuit 620*b*. Enabling bypass switch 660*a* may allow an output of scan-enabled flip-flop circuit 620*a* to be routed around the faulty scan-enabled flip-flop circuit 620*b* to determine whether scan-enabled flip-flop circuit 620*a* is also faulty.

In some embodiments, one of spare scan-enabled flip-flop circuits 622 may be routed in place of a faulty scan-enabled flip-flop circuit. For example, bypass switches 660*b* and 660*c* illustrate how spare scan-enabled flip-flop circuit 622*g* is routed in place of scan-enabled flip-flop circuit 620*g*. Such replacement may enable SoC 601 to continue to be used despite having a faulty scan-enabled flip-flop circuit.

It is noted that method 900 includes blocks 910-940. Method 900 may end in block 940 or may repeat some or all blocks of the method. For example, method 900 may repeat 910 and 920 one or more times for additional scan chains that are not illustrated. In a manner as described above for method 800, method 900 may be performed concurrently with other instantiations of itself and/or method 800. For example, an instance of method 800 may be performed by for a second scan chain while an instance of method 900 is performed for scan chain 610.

Figure 10:
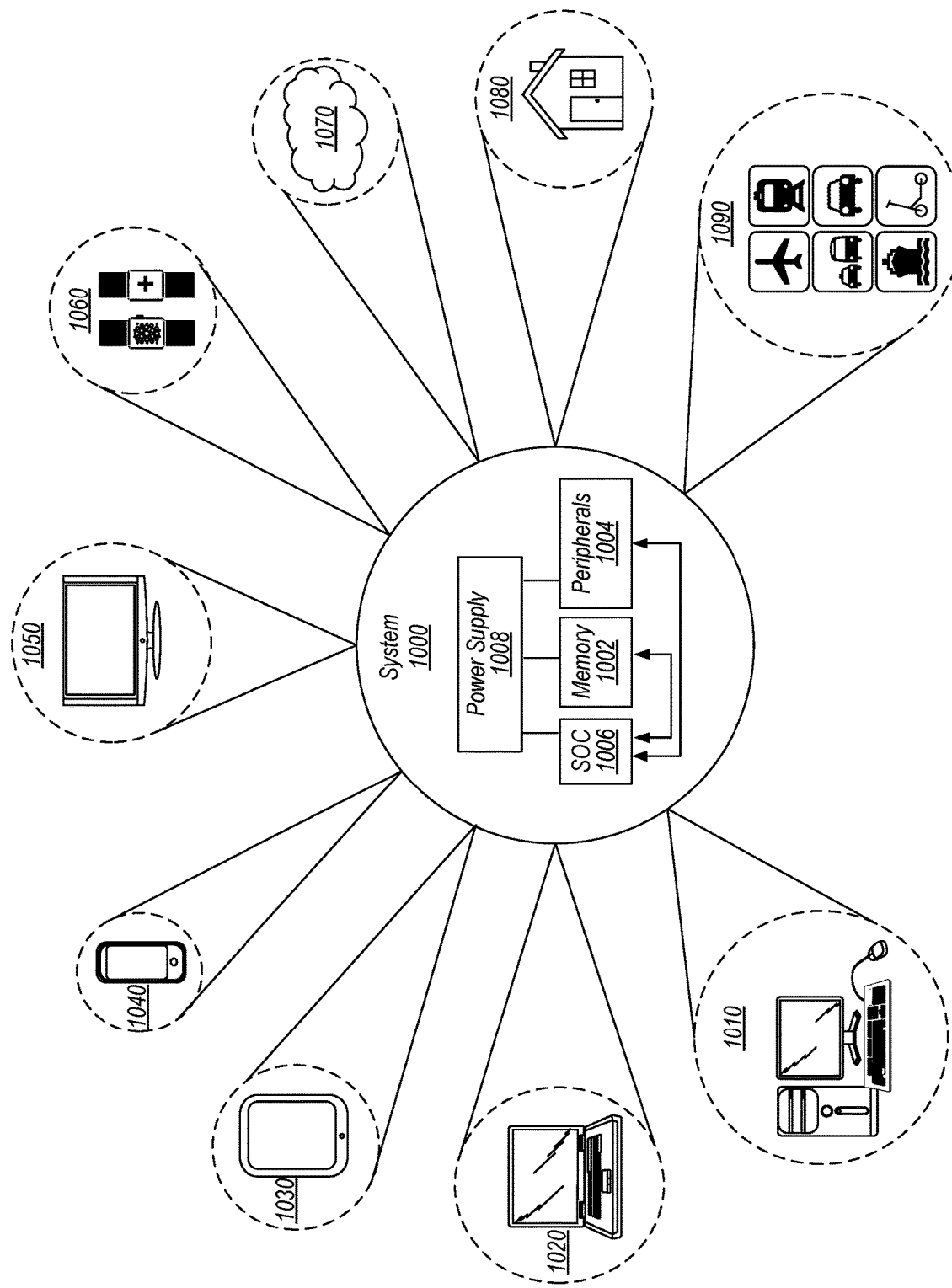
FIG. 10 depicts various embodiments of systems that include integrated circuits that utilize the disclosed techniques.

FIGS. 1-9 illustrate circuits and methods for a system, such as an integrated circuit, that include scan chains with scan signature circuits. Any embodiment of the disclosed systems may be included in one or more of a variety of computer systems, such as a desktop computer, laptop computer, smartphone, tablet, wearable device, and the like. In some embodiments, the circuits described above may be implemented on a system-on-chip (SoC) or other type of integrated circuit. A block diagram illustrating an embodiment of system 1000 is illustrated in FIG. 10. System 1000 may, in some embodiments, include any disclosed embodiment of systems disclosed herein, such as SoCs 100-300 and 601 shown in FIGS. 1-6.

In the illustrated embodiment, the system 1000 includes at least one instance of a system on chip (SoC) 1006 which may include multiple types of processor circuits, such as a central processing unit (CPU), a graphics processing unit (GPU), or otherwise, a communication fabric, and interfaces to memories and input/output devices. SoC 1006 may correspond to an instance of the SoCs disclosed herein. In various embodiments, SoC 1006 is coupled to external memory circuit 1002, peripherals 1004, and power supply 1008.

A power supply 1008 is also provided which supplies the supply voltages to SoC 1006 as well as one or more supply voltages to external memory circuit 1002 and/or the peripherals 1004. In various embodiments, power supply 1008 represents a battery (e.g., a rechargeable battery in a smart phone, laptop or tablet computer, or other device). In some embodiments, more than one instance of SoC 1006 is included (and more than one external memory circuit 1002 is included as well.

External memory circuit 1002 is any type of memory, such as dynamic random-access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. In some embodiments, external memory circuit 1002 may include non-volatile memory such as flash memory, ferroelectric random-access memory (FRAM), or magnetoresistive RAM (MRAM). One or more memory devices may be coupled onto a circuit board to form memory modules such as single inline memory modules (SIMMs), dual inline memory modules (DIMMs), etc. Alternatively, the devices may be mounted with a SoC or an integrated circuit in a chip-on-chip configuration, a package-on-package configuration, or a multi-chip module configuration.

The peripherals 1004 include any desired circuitry, depending on the type of system 1000. For example, in one embodiment, peripherals 1004 includes devices for various types of wireless communication, such as Wi-Fi, Bluetooth, cellular, global positioning system, etc. In some embodiments, the peripherals 1004 also include additional storage, including RAM storage, solid state storage, or disk storage. The peripherals 1004 include user interface devices such as a display screen, including touch display screens or multi-touch display screens, keyboard or other input devices, microphones, speakers, etc.

As illustrated, system 1000 is shown to have application in a wide range of areas. For example, system 1000 may be utilized as part of the chips, circuitry, components, etc., of a desktop computer 1010, laptop computer 1020, tablet computer 1030, cellular or mobile phone 1040, or television 1050 (or set-top box coupled to a television). Also illustrated is a smartwatch and health monitoring device 1060. In some embodiments, the smartwatch may include a variety of general-purpose computing related functions. For example, the smartwatch may provide access to email, cellphone service, a user calendar, and so on. In various embodiments, a health monitoring device may be a dedicated medical device or otherwise include dedicated health related functionality. In various embodiments, the above-mentioned smartwatch may or may not include some or any health monitoring related functions. Other wearable devices 1060 are contemplated as well, such as devices worn around the neck, devices attached to hats or other headgear, devices that are implantable in the human body, eyeglasses designed to provide an augmented and/or virtual reality experience, and so on.

System 1000 may further be used as part of a cloud-based service(s) 1070. For example, the previously mentioned devices, and/or other devices, may access computing resources in the cloud (i.e., remotely located hardware and/or software resources). Still further, system 1000 may be utilized in one or more devices of a home 1080 other than those previously mentioned. For example, appliances within the home may monitor and detect conditions that warrant attention. Various devices within the home (e.g., a refrigerator, a cooling system, etc.) may monitor the status of the device and provide an alert to the homeowner (or, for example, a repair facility) should a particular event be detected. Alternatively, a thermostat may monitor the temperature in the home and may automate adjustments to a heating/cooling system based on a history of responses to various conditions by the homeowner. Also illustrated in FIG. 10 is the application of system 1000 to various modes of transportation 1090. For example, system 1000 may be used in the control and/or entertainment systems of aircraft, trains, buses, cars for hire, private automobiles, waterborne vessels from private boats to cruise liners, scooters (for rent or owned), and so on. In various cases, system 1000 may be used to provide automated guidance (e.g., self-driving vehicles), general systems control, and otherwise.

It is noted that the wide variety of potential applications for system 1000 may include a variety of performance, cost, and power consumption requirements. Accordingly, a scalable solution enabling use of one or more integrated circuits to provide a suitable combination of performance, cost, and power consumption may be beneficial. These and many other embodiments are possible and are contemplated. It is noted that the devices and applications illustrated in FIG. 10 are illustrative only and are not intended to be limiting. Other devices are possible and are contemplated.

As disclosed in regards to FIG. 10, system 1000 may include one or more integrated circuits included within a personal computer, smart phone, tablet computer, or other type of computing device. A process for designing and producing an integrated circuit using design information is presented below in FIG. 11.

Figure 11:
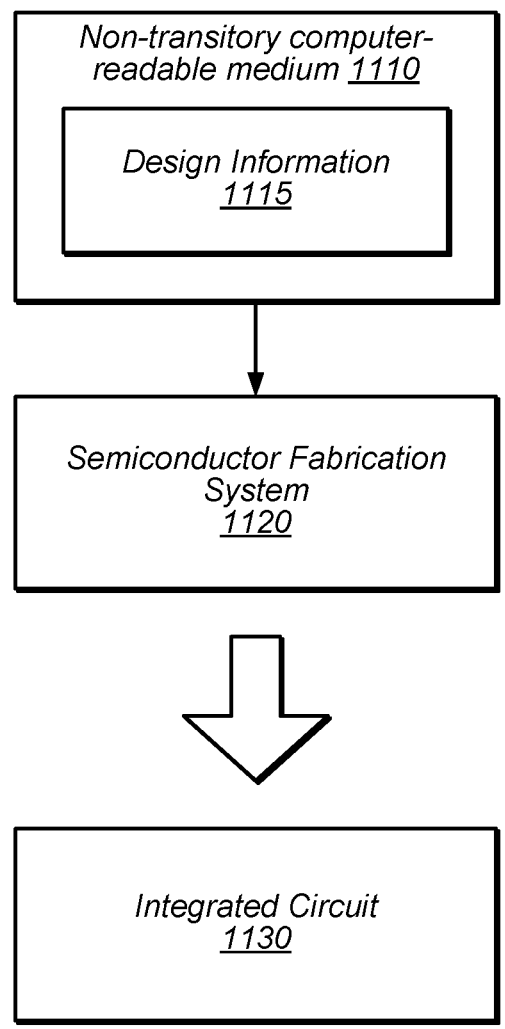
FIG. 11 is a block diagram of an example computer-readable medium, according to some embodiments.

FIG. 11 is a block diagram illustrating an example of a non-transitory computer-readable storage medium that stores circuit design information, according to some embodiments. The embodiment of FIG. 11 may be utilized in a process to design and manufacture integrated circuits, for example, including one or more instances of SoCs (or portions thereof) 100-300 and 601 as shown in FIGS. 1-6. In the illustrated embodiment, semiconductor fabrication system 1120 is configured to process the design information 1115 stored on non-transitory computer-readable storage medium 1110 and fabricate integrated circuit 1130 based on the design information 1115.

Non-transitory computer-readable storage medium 1110, may comprise any of various appropriate types of memory devices or storage devices. Non-transitory computer-readable storage medium 1110 may be an installation medium, e.g., a CD-ROM, floppy disks, or tape device; a computer system memory or random-access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. Non-transitory computer-readable storage medium 1110 may include other types of non-transitory memory as well or combinations thereof. Non-transitory computer-readable storage medium 1110 may include two or more memory mediums which may reside in different locations, e.g., in different computer systems that are connected over a network.

Design information 1115 may be specified using any of various appropriate computer languages, including hardware description languages such as, without limitation: VHDL, Verilog, SystemC, SystemVerilog, RHDL, M, MyHDL, etc. In some embodiments, design information 1115 may correspond to SoC design information 790*a* and 790*b* of FIG. 7, and generated using computer system 700. Design information 1115 may be usable by semiconductor fabrication system 1120 to fabricate at least a portion of integrated circuit 1130. The format of design information 1115 may be recognized by at least one semiconductor fabrication system, such as semiconductor fabrication system 1120, for example. In some embodiments, design information 1115 may include a netlist that specifies elements of a cell library, as well as their connectivity. One or more cell libraries used during logic synthesis of circuits included in integrated circuit 1130 may also be included in design information 1115. Such cell libraries may include information indicative of device or transistor level netlists, mask design data, characterization data, and the like, of cells included in the cell library.

Integrated circuit 1130 may, in various embodiments, include one or more custom macrocells, such as memories, analog or mixed-signal circuits, and the like. In such cases, design information 1115 may include information related to included macrocells. Such information may include, without limitation, schematics capture database, mask design data, behavioral models, and device or transistor level netlists. As used herein, mask design data may be formatted according to graphic data system (gdsii), or any other suitable format.

Semiconductor fabrication system 1120 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 1120 may also be configured to perform various testing of fabricated circuits for correct operation.

In various embodiments, integrated circuit 1130 is configured to operate according to a circuit design specified by design information 1115, which may include performing any of the functionality described herein. For example, integrated circuit 1130 may include any of various elements shown or described herein. Further, integrated circuit 1130 may be configured to perform various functions described herein in conjunction with other components.

As used herein, a phrase of the form "design information that specifies a design of a circuit configured to . . ." does not imply that the circuit in question must be fabricated in order for the element to be met. Rather, this phrase indicates that the design information describes a circuit that, upon being fabricated, will be configured to perform the indicated actions or will include the specified components.

The present disclosure includes references to an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as being "configured to" perform some task refers to something physical, such as a device, circuit, a system having a processor unit and a memory storing program instructions executable to implement the task, etc. This phrase is not used herein to refer to something intangible.

In some cases, various units/circuits/components may be described herein as performing a set of task or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112(f) for that claim element. Should Applicant wish to invoke Section 112(f) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), functional unit, memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements may be defined by the functions or operations that they are configured to implement. The arrangement and such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and other circuit elements (e.g. passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

What is claimed is:

1. An apparatus comprising:
    a plurality of circuit blocks;
    a plurality of scan-enabled flip-flop circuits, coupled in a sequential manner across the plurality of circuit blocks, configured to shift a scan chain test signal from a test input interface to a test output interface; and
    a plurality of scan signature circuits, coupled to respective ones of a subset of the plurality of scan-enabled flip-flop circuits, and configured to:
        in response to a particular test signal, concurrently load a known scan-chain pattern to the subset of the scan-enabled flip-flop circuits; and
    wherein the plurality of scan-enabled flip-flop circuits is further configured to sequentially output at least a portion of the known scan-chain pattern to the test output interface.

2. The apparatus of claim 1, wherein to concurrently load the known scan-chain pattern, a given one of the plurality of scan signature circuits is configured to shift a corresponding portion of the known scan-chain pattern into a scan input node of a respective one of the subset of scan-enabled flip-flop circuits.

3. The apparatus of claim 1, wherein the plurality of scan signature circuits is further configured to select, based on a value of the particular test signal, one of a plurality of known scan-chain patterns to concurrently load into the subset of the scan-enabled flip-flop circuits.

4. The apparatus of claim 3, wherein a first pattern of the plurality of known scan-chain patterns is a repetitive pattern of a particular sequence of high and low logic states.

5. The apparatus of claim 3, wherein a first pattern of the plurality of known scan-chain patterns is an inverse of a second pattern of the plurality of known scan-chain patterns.

6. The apparatus of claim 1, wherein a given scan-enabled flip-flop circuit is configured to receive a data input signal that is derived based on a plurality of logic paths that include respective scan-enabled flip-flop circuits, and wherein the given scan-enabled flip-flop circuit is excluded from coupling to a respective scan signature circuit.

7. The apparatus of claim 1, further including a test circuit configured to:
    identify a failing one of the plurality of scan-enabled flip-flop circuits; and enable an alternate scan chain path that avoids the failing scan-enabled flip-flop circuit in the scan chain.

8. The apparatus of claim 1, wherein the plurality of scan signature circuits is included within the respective ones of the subset of the plurality of scan-enabled flip-flop circuits.

9. A method, comprising:
shifting, by a scan chain that includes a plurality of scan-enabled flip-flop circuits, a scan-chain pattern from an input port of a test interface of an integrated circuit to an output port of the test interface, wherein at least one of the plurality of scan-enabled flip-flop circuits fails to shift the scan-chain pattern;
after the scan-chain pattern fails to be shifted to the output port, concurrently loading, by a plurality of scan signature circuits that are coupled to respective ones of a subset of the plurality of scan-enabled flip-flop circuits, a known scan-chain pattern to the subset of the scan-enabled flip-flop circuits; and
shifting, by a functioning portion of the scan chain, at least a portion of the known scan-chain pattern to the output port.

10. The method of claim 9, wherein the functioning portion of the scan chain includes a sequence of the plurality of scan-enabled flip-flop circuits arranged between a failing one of the plurality of scan-enabled flip-flop circuits and the output port.

11. The method of claim 9, further comprising:
after shifting the at least the portion of the known scan-chain pattern to the output port, concurrently loading, by the plurality of scan signature circuits, an inverse of the known scan-chain pattern to the subset of the scan-enabled flip-flop circuits; and
shifting, by the functioning portion of the scan chain, at least a portion of the inverse of the known scan-chain pattern to the output port.

12. The method of claim 9, wherein concurrently loading the known scan-chain pattern includes:
asserting, by a first scan signature circuit, a set node of a respective one of the subset of scan-enabled flip-flop circuits; and
asserting, by a second scan signature circuit while the first scan signature circuit asserts the set node, a reset node of a different one of the subset of scan-enabled flip-flop circuits.

13. The method of claim 9, further comprising configured to:
identifying, by a test circuit, a failing one of the plurality of scan-enabled flip-flop circuits; and
enabling, by the test circuit, an alternate scan chain path that avoids the failing scan-enabled flip-flop circuit in the scan chain.

14. The method of claim 13, wherein enabling the alternate scan chain path includes enabling a bypass switch circuit to route an input node of the failing scan-enabled flip-flop circuit to an output node of the failing scan-enabled flip-flop circuit.

15. A computer-readable, non-transitory storage medium having design information stored thereon, wherein the design information specifies a design of at least a portion of a hardware integrated circuit in a format recognized by a semiconductor manufacturing system that is configured to use the design information to produce the hardware integrated circuit according to the design information, and wherein the design information specifies that the hardware integrated circuit comprises:
a plurality of circuit blocks;
a plurality of scan-enabled flip-flop circuits, forming one or more scan chains across the plurality of circuit blocks, configured to shift a scan chain test signal from a test input interface to a test output interface; and
a plurality of scan signature circuits, included in respective ones of a subset of the plurality of scan-enabled flip-flop circuits, and configured to concurrently load, in response to a particular signal, a known scan-chain pattern to the subset of the scan-enabled flip-flop circuits; and
wherein the plurality of scan-enabled flip-flop circuits is further configured to sequentially output at least a portion of the known scan-chain pattern to the test output interface.

16. The computer-readable, non-transitory storage medium of claim 15, wherein the plurality of scan signature circuits is further configured to concurrently load a selected one of a plurality of known scan-chain patterns to the subset of the scan-enabled flip-flop circuits based on a value of the particular signal.

17. The computer-readable, non-transitory storage medium of claim 15, wherein the known scan-chain pattern is a repetitive pattern of a particular sequence of high and low logic states.

18. The computer-readable, non-transitory storage medium of claim 15, wherein the plurality of scan-enabled flip-flop circuits form a plurality of scan chains and includes a given scan-enabled flip-flop circuit that is configured to receive a data input signal that is derived from a threshold number of the plurality of scan chains, and wherein the given scan-enabled flip-flop circuit is excluded from the subset of the plurality of scan-enabled flip-flop circuits.

19. The computer-readable, non-transitory storage medium of claim 15, wherein the hardware integrated circuit further comprises:
a test circuit configured to:
identify a failing one of the plurality of scan-enabled flip-flop circuits; and
enable an alternate scan chain path that avoids the failing scan-enabled flip-flop circuit in the scan chain.

20. The computer-readable, non-transitory storage medium of claim 19, wherein to enable the alternate scan chain path, the test circuit is further configured to:
activate a first set of bypass switch circuits to route an input node of the failing scan-enabled flip-flop circuit to an input node of a spare scan-enabled flip-flop circuit; and
activate a second set of bypass switch circuits to route an output node of the spare scan-enabled flip-flop circuit to an output node of the failing scan-enabled flip-flop circuit.

* * * * *